United States Patent
Fujitani et al.

(10) Patent No.: US 10,260,687 B2
(45) Date of Patent: Apr. 16, 2019

(54) LIGHT-EMITTING MODULE AND LIGHTING FIXTURE

(71) Applicant: PANASONIC INTELLECTUAL PROPERTY MANAGEMENT CO., LTD., Osaka (JP)

(72) Inventors: Hisaki Fujitani, Kyoto (JP); Masumi Abe, Osaka (JP); Kosuke Takehara, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 8 days.

(21) Appl. No.: 15/790,674

(22) Filed: Oct. 23, 2017

(65) Prior Publication Data

US 2018/0119898 A1 May 3, 2018

(30) Foreign Application Priority Data

Oct. 27, 2016 (JP) .................................. 2016-210933

(51) Int. Cl.
| | |
|---|---|
| *F21K 9/64* | (2016.01) |
| *H01L 25/075* | (2006.01) |
| *F21K 9/00* | (2016.01) |
| *F21V 5/00* | (2018.01) |
| *F21V 7/00* | (2006.01) |

(Continued)

(52) U.S. Cl.
CPC ................. *F21K 9/64* (2016.08); *F21K 9/00* (2013.01); *F21V 5/00* (2013.01); *F21V 7/0091* (2013.01); *H01L 25/0753* (2013.01); *F21K 9/23* (2016.08); *F21K 9/27* (2016.08); *F21K 9/68* (2016.08); *F21K 9/69* (2016.08); *F21S 8/04* (2013.01); *F21V 5/04* (2013.01); *F21V 13/02* (2013.01); *F21Y 2103/10* (2016.08); *F21Y 2115/10* (2016.08)

(58) Field of Classification Search
None
See application file for complete search history.

(56) References Cited

U.S. PATENT DOCUMENTS

| | | | | |
|---|---|---|---|---|
| 2007/0132356 A1* | 6/2007 | Hashimoto | ......... | H01L 27/3246 313/292 |
| 2015/0049480 A1* | 2/2015 | Ogata | ................. | H01L 25/0753 362/235 |

FOREIGN PATENT DOCUMENTS

| | | |
|---|---|---|
| JP | 2011-176017 | 9/2011 |
| JP | 2012-044048 | 3/2012 |

(Continued)

*Primary Examiner* — Nimeshkumar D Patel
*Assistant Examiner* — Jacob R Stern
(74) *Attorney, Agent, or Firm* — Greenblum & Bernstein, P.L.C.

(57) ABSTRACT

A light-emitting module is provided. The light emitting module includes a substrate; a thin-film layer that is disposed above the substrate, the thin-film layer defining an opening that exposes a surface of the substrate; a light-emitting element disposed above the substrate and in the opening; and a sealant disposed above the substrate and in the opening, the sealant containing a wavelength converter and sealing the light-emitting element. A thickness of the thin-film layer is less than a thickness of the sealant. An edge portion of the sealant is in contact with the thin-film layer. The surface of the substrate and a surface of the thin-film layer are hydrophilic. The surface of the thin-film layer has a lower wettability than a wettability of the surface of the substrate.

18 Claims, 9 Drawing Sheets

(51) Int. Cl.

| | |
|---|---|
| F21Y 115/10 | (2016.01) |
| F21S 8/04 | (2006.01) |
| F21K 9/23 | (2016.01) |
| F21K 9/27 | (2016.01) |
| F21Y 103/10 | (2016.01) |
| F21V 5/04 | (2006.01) |
| F21V 13/02 | (2006.01) |
| F21K 9/69 | (2016.01) |
| F21K 9/68 | (2016.01) |

(56) References Cited

FOREIGN PATENT DOCUMENTS

| | | |
|---|---|---|
| JP | 2014-049504 | 3/2014 |
| JP | 2014-086694 | 5/2014 |
| JP | 2014-120571 | 6/2014 |

\* cited by examiner

LIGHT-EMITTING MODULE AND LIGHTING FIXTURE

CROSS REFERENCE TO RELATED APPLICATION

This application claims the benefit of priority of Japanese Patent Application Number 2016-210933 filed on Oct. 27, 2016, the entire content of which is hereby incorporated by reference.

BACKGROUND

1. Technical Field

The present disclosure relates to a light-emitting module lighting fixture including a light-emitting module.

2. Description of the Related Art

Semiconductor light-emitting elements such as light-emitting diodes (LEDs) are widely used as light sources in a variety of devices due to their high efficiency and long life span. For example, LEDs are used as light sources for lighting purposes in, for example, lighting fixtures or lamps, and as backlight light sources in, for example, liquid crystal displays.

Typically, LEDs are used in various devices in units referred to as LED modules. An LED module includes, for example, a substrate and one or more LEDs mounted on the substrate (for example, see Japanese Unexamined Patent Application Publication No. 2011-176017).

One example of a known LED module is a chip on board (COB) type module in which one or more LEDs (LED chips) are directly mounted on a substrate. A COB type LED module includes, for example, a substrate, a plurality of LED chips mounted on the substrate, and a sealant that collectively seals the plurality of LED chips. For example, the sealant is made of a resin material containing phosphor. With this configuration, the light from the LED chips and the light from the phosphor mixes in the sealant, whereby light of a predetermined color is emitted from the sealant.

SUMMARY

One problem with the structure of a conventional COB type LED module is that when there is a deviation in the positional relationship between an LED chip and the sealant, it results in an unevenness in color.

The present disclosure was conceived to overcome such a problem and has an object to provide a light-emitting module and lighting fixture capable of inhibiting color unevenness resulting from a positional deviation between a light-emitting element and the sealant.

In order to achieve the above-described object, a light-emitting module according to one aspect of the present invention includes: a substrate; a thin-film layer disposed above the substrate, the thin-film layer defining an opening that exposes a surface of the substrate; a light-emitting element disposed above the substrate and in the opening; and a sealant disposed above the substrate and in the opening, the sealant containing a wavelength converter and sealing the light-emitting element. The thickness of the thin-film layer is less than the thickness of the sealant. An edge portion of the sealant is in contact with the thin-film layer. The surface of the substrate and the surface of the thin-film layer are hydrophilic. The surface of the thin-film layer has a lower wettability than the wettability of the surface of the substrate.

Moreover, a lighting fixture according to one aspect of the present invention includes the above-described light-emitting module.

Moreover, a light-emitting module manufacturing method according to one aspect of the present invention includes: forming a thin-film layer on a substrate, the thin-film layer defining an opening; mounting a light-emitting element on the substrate, in the opening; and forming a sealant on the substrate, in the opening. The forming of the sealant includes applying a sealant material on the substrate to seal the light-emitting element, the sealant material containing a wavelength converter. The thickness of the thin-film layer is less than the thickness of the sealant material. The surface of the substrate and the surface of the thin-film layer are hydrophilic. The surface of the thin-film layer has a lower wettability than the wettability of the surface of the substrate.

According to the present disclosure, it is possible to inhibit color unevenness resulting from a positional deviation between a light-emitting element and the sealant.

BRIEF DESCRIPTION OF DRAWINGS

The figures depict one or more implementations in accordance with the present teaching, by way of examples only, not by way of limitations. In the figures, like reference numerals refer to the same or similar elements.

DETAILED DESCRIPTION OF THE EMBODIMENTS

The following describes exemplary embodiments of the present disclosure. Each of the embodiments described below is merely one specific example of the present disclosure. The numerical values, shapes, materials, elements, arrangement and connection of the elements, steps, and order of the steps, etc., indicated in the following embodiments are given merely by way of illustration and are not intended to limit the present disclosure. Therefore, among elements in the following embodiments, those not recited in any one of the independent claims defining the broadest inventive concept of the present disclosure are described as optional elements.

Note that the figures are schematic illustrations and are not necessarily precise depictions. Accordingly, the figures are not necessarily to scale. Moreover, in the figures, elements that are essentially the same share like reference signs. Accordingly, duplicate description is omitted or simplified.

Moreover, in the detailed description and drawings, the X, Y, and Z axes indicate the three axes in a three-dimensional orthogonal coordinate system, and in this embodiment, directions parallel to the Z axis extend in vertical directions, and directions perpendicular to the Z axis (i.e., directions parallel to the XY plane) extend in horizontal directions. The X and Y axes are orthogonal to one another and the Z axis.

Embodiment 1

Figure 1:
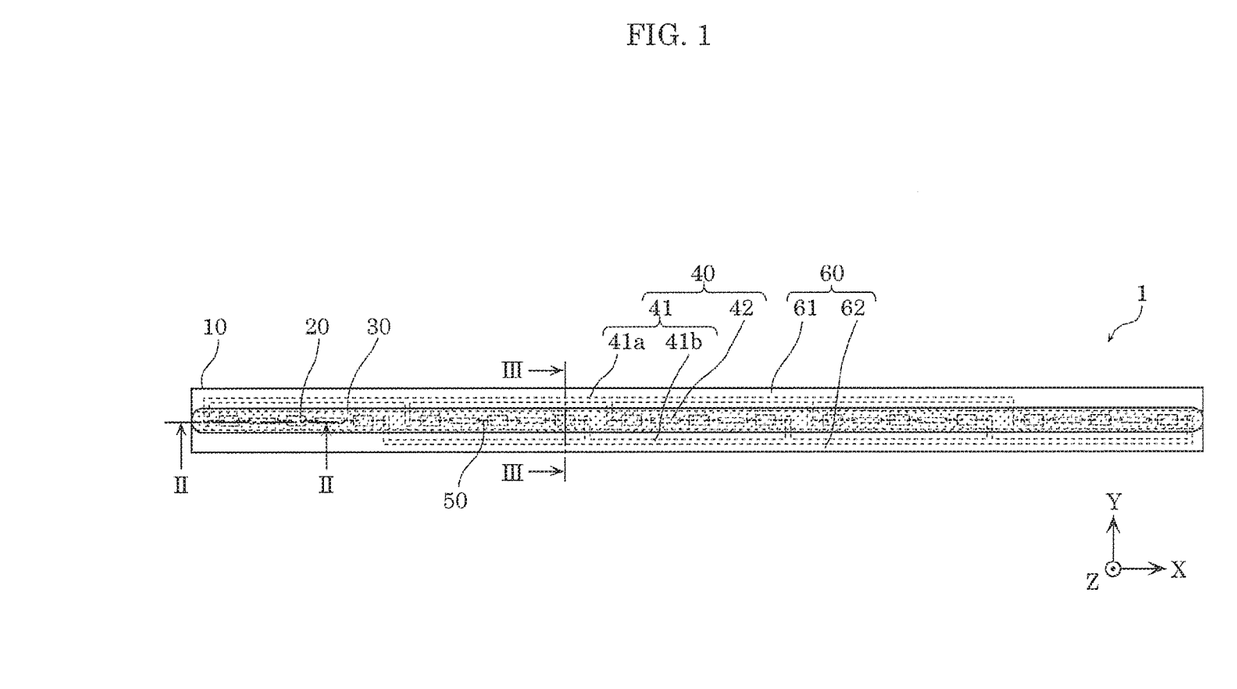
FIG. 1 is a plan view of the light-emitting module according to Embodiment 1.
Figure 2:
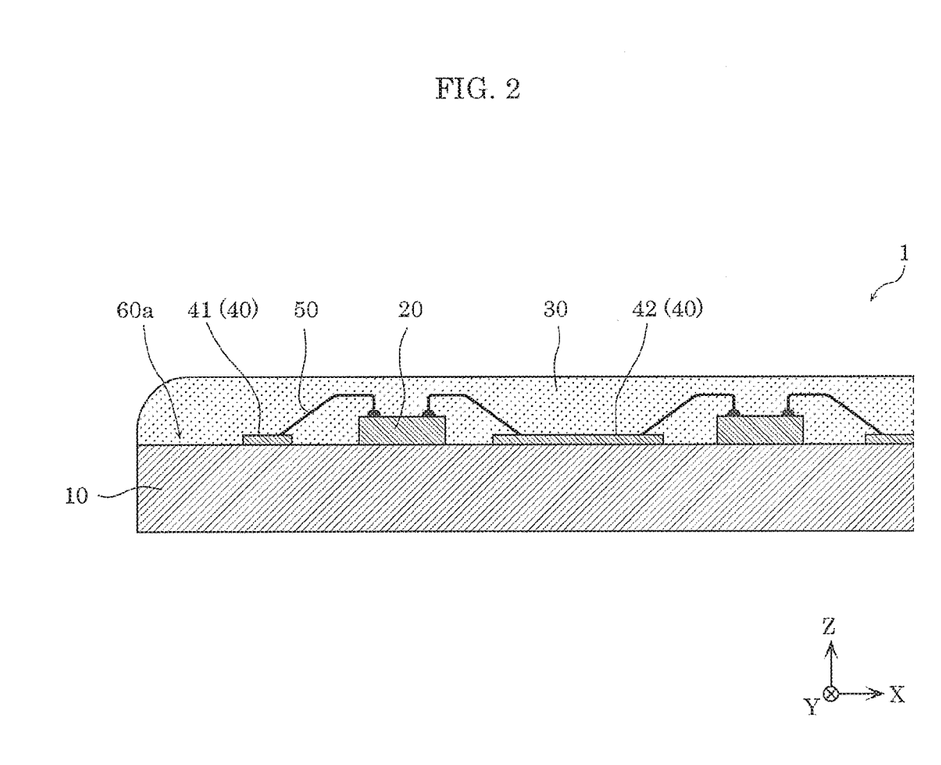
FIG. 2 is a cross sectional view of part of the light-emitting module according to Embodiment 1, taken at line II-II in FIG. 1.
Figure 3:
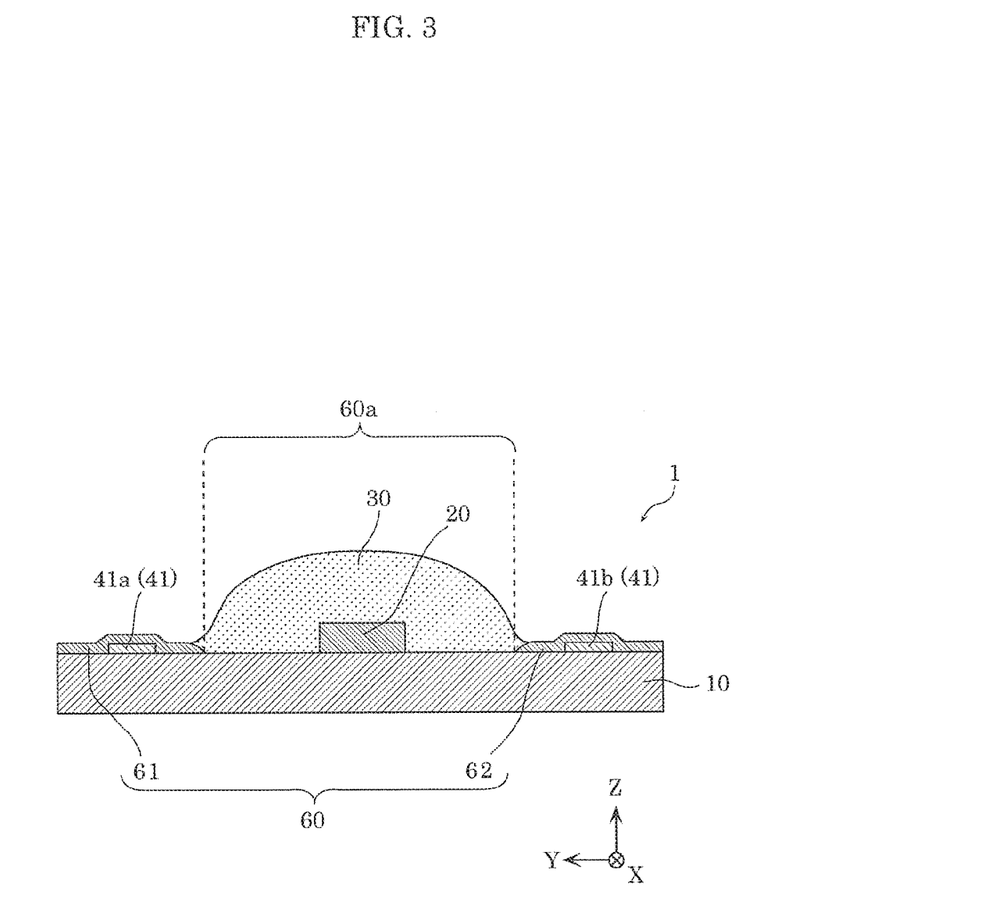
FIG. 3 is a cross sectional view of the light-emitting module according to Embodiment 1, taken at line III-III in FIG. 1.

The configuration of light-emitting module 1 according to Embodiment 1 will be described with reference to FIG. 1 through FIG. 3. FIG. 1 is a plan view of light-emitting module 1 according to Embodiment 1. FIG. 2 is a cross sectional view of part of light-emitting module 1 according to Embodiment 1, taken at line II-II in FIG. 1. FIG. 3 is a cross sectional view of light-emitting module 1 according to Embodiment 1, taken at line III-III in FIG. 1.

As illustrated in FIG. 1 through FIG. 3, light-emitting module 1 includes substrate 10, light-emitting elements 20, sealant 30, printed wiring 40, wires 50, and thin-film layer 60.

Light-emitting module 1 according to this embodiment is a linear light source that emits light in a line. Light-emitting module 1 according to this embodiment emits, for example, white light. Moreover, light-emitting module 1 is a COB type LED module in which LED chips, corresponding to light-emitting elements 20, are directly mounted onto substrate 10.

Hereinafter, each element included in light-emitting module 1 will be described in detail with reference to FIG. 1 through FIG. 3.

(Substrate)

Substrate 10 is a mounting substrate for mounting light-emitting elements 20. For example, a ceramic substrate made of ceramic, a resin substrate including resin as a base material, a metal-based substrate including metal as a base material, or a glass substrate made of glass can be used as substrate 10.

For example, an alumina substrate made of alumina or an aluminum nitride substrate made of aluminum nitride can be used as the ceramic substrate. For example, a glass epoxy substrate made of fiberglass and epoxy resin (for example, CEM-3 or FR-4), a substrate made of paper-based phenol or paper-based epoxy (for example, FR-1), or a flexible substrate made of, for example, polyimide, can be used as the resin substrate. For example, an aluminum alloy, iron alloy, or copper alloy substrate whose surface is covered with an electrically insulating film can be used as the metal-based substrate. Note that substrate 10 is not limited to a rigid substrate, and may be a flexible substrate.

The surface of substrate 10 is hydrophilic. More specifically, when substrate 10 is a ceramic substrate, the ceramic surface is hydrophilic. When substrate 10 is a resin substrate, the resin surface is hydrophilic. When substrate 10 is a metal-based substrate, the resin surface of the resin film covering the metal is hydrophilic or when the metal is not covered by a resin film and is exposed, the metal surface is hydrophilic. When the surface of substrate 10 is hydrophilic, the contact angle of the surface of substrate 10 is at least 90 degrees. Note that the contact angle is a contact angle relative to water (water contact angle).

A white substrate having a high reflectivity (for example, a reflectivity of at least 90%) is desirably used as substrate 10. Using a white substrate makes it possible to reflect light from light-emitting elements 20 off the surface of substrate 10, thereby increasing the light extraction efficiency of light-emitting module 1. In this embodiment, a white ceramic substrate is used as substrate 10. In this case, a white polycrystalline alumina substrate (polycrystalline ceramic substrate) formed by sintering alumina particles and having, for example, a thickness of approximately 1 mm, can be used as substrate 10. Ceramic substrates have a higher thermal conductivity than resin substrates, and can efficiently dissipate heat generated by light-emitting elements 20. Moreover, ceramic substrates have a low deterioration rate, and are highly heat resistant.

In this embodiment, substrate 10 has the shape of an oblong rectangle. In other words, substrate 10 has an oblong rectangle plan view shape. For example, the aspect ratio (L1/L2) of oblong substrate 10 satisfies L1/L2≥10, where L1 is the measurement of substrate 10 in the lengthwise direction (length of a long side) and L2 is the measurement of substrate 10 in the crosswise direction (length of a short side).

A pair of electrode terminals for receiving, from a source external to light-emitting module 1, DC power for causing light-emitting elements 20 to emit light is disposed on substrate 10. The pair of electrode terminals is electrically connected to a power supply device (power supply circuit) via, for example, a lead wire. The power received by the pair of electrode terminals is supplied to light-emitting elements 20 via printed wiring 40.

(Light-Emitting Elements)

Light-emitting elements 20 are one example of semiconductor light-emitting elements, and emit light upon receiving predetermined power. In this embodiment, light-emitting elements 20 are bare chips (LED chips) that emit monochromatic visible light, and are, for example, blue LED chips that emit blue light when current passes therethrough. Gallium nitride semiconductor light-emitting elements having a center wavelength in a range of from 440 nm to 470 nm, inclusive, can be used as the blue LED chips. In one example, the blue LED chips are semiconductor light-emitting elements having a one-sided electrode structure in which both p and n electrodes are formed on the top surface of an InGaN nitride semiconductor layer formed on a sapphire substrate. Note that light-emitting elements 20 may have a two-sided electrode structure.

Light-emitting elements 20 are disposed on substrate 10. In this embodiment, light-emitting elements 20 are directly mounted on one major surface of substrate 10. More specifically, light-emitting elements 20 are die bonded to a surface (in this embodiment, the ceramic surface) of substrate 10 using, for example, a die attachment substance. Light-emitting elements 20 mounted on substrate 10 are covered by sealant 30.

Moreover, as illustrated in FIG. 3, light-emitting elements 20 are disposed in opening 60a defined by thin-film layer 60. In other words, light-emitting elements 20 are mounted on substrate 10 in positions in opening 60a defined by thin-film layer 60. More specifically, since the mounting positions of light-emitting elements 20 are set to be in the central region in opening 60a defined by thin-film layer 60, light-emitting elements 20 are disposed in positions in the central region of opening 60a defined by thin-film layer 60. In other words, the center of each light-emitting element 20 matches the center between first straight line part 61 and second straight line part 62 of thin-film layer 60.

Light-emitting elements 20 are mounted in a row between first straight line part 61 and second straight line part 62 of thin-film layer 60. As illustrated in FIG. 1, in this embodiment, substrate 10 is oblong, and light-emitting elements 20 are mounted arranged in a straight line along the lengthwise direction of substrate 10. More specifically, light-emitting elements 20 are arranged in no more than one line along the lengthwise direction of substrate 10. Moreover, light-emitting elements 20 are arranged spaced apart from one another at a uniform pitch, whereby the distance between two adjacent light-emitting elements 20 is the same, but the arrangement of light-emitting elements 20 is not limited to this example.

Note that in this embodiment, two adjacent light-emitting elements 20 are electrically connected via printed wiring 40 and wires 50 disposed between the two adjacent light-emitting elements 20, but the configuration is not limited to this example. For example, light-emitting elements 20 may be configured such that two adjacent light-emitting elements 20 are directly connected via wire 50. In other words, two adjacent light-emitting elements 20 may be wire bonded in a chip-to-chip configuration. Moreover, light-emitting elements 20 may be connected to printed wiring 40 in a flip chip connection without the use of wires 50.

(Sealant)

As illustrated in FIG. 1 and FIG. 2, sealant 30 seals light-emitting elements 20. More specifically, sealant 30 is formed on substrate 10 so as to cover light-emitting elements 20. Sealant 30 collectively seals light-emitting elements 20 arranged in a straight line. In other words, sealant 30 extends in a straight line on a major surface of substrate 10 along the arrangement direction of light-emitting elements 20. This makes it possible to produce a light emitter that continuously extends in a straight line.

In this embodiment, sealant 30 extends along the lengthwise direction of substrate 10. More specifically, sealant 30 extends from one of the two short sides of substrate 10 to the other. In other words, sealant 30 extends to both edges in the lengthwise direction of the substrate 10, and extends continuously, without interruption, from one short side of substrate 10 to the other opposing short side of substrate 10.

As illustrated in FIG. 3, sealant 30 is firmed on substrate 10 in opening 60a defined by thin-film layer 60. As illustrated in FIG. 1, sealant 30 extends in a straight line between first straight line part 61 and second straight line part 62 of thin-film layer 60.

Moreover, as illustrated in FIG. 3, an edge portion of sealant 30 is in contact with thin-film layer 60. In this embodiment, both edge portions in the widthwise direction of sealant 30 are in contact with thin-film layer 60, and sealant 30 extends out from both sides of each light-emitting element 20 relative to the center of each light-emitting element 20. More specifically, one edge portion in the widthwise direction of sealant 30 is in contact with first straight line part 61 of thin-film layer 60 so as to be on top of the edge of first straight line part 61. The other edge portion in the widthwise direction of sealant 30 is in contact with second straight line part 62 of thin-film layer 60 so as to be on top of the edge of second straight line part 62. In other words, in plan view, the edge portion on the sealant 30 side of thin-film layer 60 and the edge portion on the thin-film layer 60 side of sealant 30 overlap.

Sealant 30 is made of a resin material containing a wavelength converter. An electrically insulating resin material having light-transmissive properties, such as a silicon resin, epoxy resin, or fluorocarbon resin can be used as the resin material for sealant 30. The wavelength converter contained in sealant 30 converts the wavelength of light emitted by light-emitting elements 20 into a predetermined wavelength. In this embodiment, sealant 30 contains phosphor as the wavelength converter, and thus is a phosphor-containing resin, which is a resin material dispersed with phosphor. The phosphor in sealant 30 is excited by light emitted by light-emitting elements 20, which produces fluorescence, resulting in the radiation of light of a predetermined color (wavelength).

In this embodiment, since blue LED chips are used as light-emitting elements 20, in order to produce white light, for example, yttrium aluminum garnet (YAG) yellow phosphor can be used as the phosphor. With this, a portion of the blue light emitted by the blue LED chips is absorbed by the yellow phosphor and wavelength-converted into yellow light. In other words, the yellow phosphor is excited by the blue light from the blue LED chips and radiates yellow light. The yellow light from the yellow phosphor mixes with the blue light not absorbed by the yellow phosphor to produce white light as synthesized light, whereby white light is emitted from sealant 30.

Note that in order to improve color rendering properties, sealant 30 may additionally contain red phosphor. Moreover, a light diffusing material, such as silica, may be diffused in sealant 30 to improve the light diffusion properties of sealant 30, and a filler may be diffused in sealant 30 to inhibit the phosphor from settling.

Sealant 30 can be formed lay using a dispenser to apply the material (phosphor-containing resin) used for sealant 30 onto a major surface of substrate 10 in the arrangement direction of light-emitting elements 20, so as to cover light-emitting elements 20, and then curing the material. Sealant 30 formed in this manner has a low-profile, semi-cylindrical shape. In one example, the contour of the surface of sealant 30 in a YZ cross section has an overall curved shape. Moreover, in one example, the height of sealant 30 is in a range of from 0.5 mm to 1.5 mm, inclusive.

(Printed Wiring)

Printed wiring 40 is printed on substrate 10 and is electrically connected to light-emitting elements 20. For example, printed wiring 40 is printed so as to connect light-emitting elements 20 mounted on substrate 10 in series or parallel, or to connect light-emitting elements 20 in a combination of series and parallel connections.

In this embodiment, printed wiring 40 is printed in a predetermined pattern on a major surface of substrate 10, and as illustrated in FIG. 1, includes a pair of traces 41 connected to the pair of electrode terminals on substrate 10, and lands 42 between adjacent light-emitting elements 20. Some lands 42 function as bonding pads that wires 50 connect to.

As illustrated in FIG. 1 and FIG. 3, traces 41 include first trace 41a and second trace 41b that are disposed on opposite sides of the line of light-emitting elements 20 and extend in straight lines along the line of light-emitting elements 20. In other words, first trace 41a and second trace 41b extend substantially parallel to each other, along the lengthwise direction of substrate 10. First trace 41a and second trace 41b include protrusions for supplying power to light-emitting elements 20. The protrusions included in first trace 41a protrude toward second trace 41b, and protrusions included in second trace 41b protrude toward first trace 41a. The leading end portions of the protrusions also function as bonding pads.

As illustrated in FIG. 1 and FIG. 2, each land 42 electrically interconnects two adjacent light-emitting elements 20. In other words, the two light-emitting elements 20 connected by a land 42 are connected in series. Note some lands 42 functions as bonding pads that wires 50 connect to. As illustrated in FIG. 1, lands 42 are disposed between first trace 41a and second trace 41b.

Printed wiring 40 is metallic printed wiring made of a metal material. For example, copper (Cu) or silver (Ag) can be used as the metal material for printed wiring 40. Note that the surfaces of printed wiring 40 may be covered with, for example, a film of gold (Au) by plating.

(Wires)

Wires 50 are connected to each light-emitting element 20. In this embodiment, a pair of wires 50 is connected to each light-emitting element 20. Wires 50 are connected to, for example, light-emitting elements 20 and lands 42 of printed wiring 40 printed on substrate 10. In other words, light-emitting elements 20 and lands 42 are connected together by wire bonding via wires 50, where one end of wire 50 is connected to light-emitting element 20 and the other end of wire 50 is connected to land 42. This electrically connects light-emitting elements 20 and lands 42 via wires 50. Wires 50 are, for example, metal wires such as gold wires, and are disposed such that each wire 50 extends between a light-emitting element 20 and a land 42 using a capillary.

Note that some wires 50 on substrate 10 are connected to the protrusions of first trace 41a and second trace 41b included in traces 41. These wires 50 are connected to the protrusions of first trace 41a and second trace 41b and to light-emitting elements 20 mounted in the vicinity of the protrusions.

Wires 50 are sealed by sealant 30. In this embodiment, each wire 50 is completely covered by sealant 30, but a portion of wire 50 may be exposed from sealant 30. Moreover, wires 50 are disposed so as to extend in the lengthwise direction of sealant 30. In other words, in a plan view, wires 50 connected to light-emitting elements 20 are disposed a straight line.

(Thin-Film Layer)

Thin-film layer 60 is formed on substrate 10. As illustrated in FIG. 2, thin-film layer 60 defines opening 60a that exposes the surface of substrate 10. Light-emitting elements 20 and sealant 30 are located in opening 60a defined by thin-film layer 60. Thin-film layer 60 is a superficial layer formed on the surface of substrate 10 and is a peripheral layer formed in the periphery of light-emitting elements 20 and sealant 30.

As illustrated in FIG. 1 and FIG. 3, thin-film layer 60 includes first straight line part 61 that extends in a straight line and second straight line part 62 that extends in a straight line. Second straight line part 62 is spaced from and parallel to first straight line part 61. Opening 60a defined by thin-film layer 60 corresponds to the gap between first straight line part 61 and second straight line part 62. In other words, light-emitting elements 20 are disposed between first straight line part 61 and second straight line part 62. First straight line part 61 and second straight line part 62 are disposed on opposite sides of the line of light-emitting elements 20, and extend in straight lines along the line of light-emitting elements 20. Moreover, sealant 30 is disposed between first straight line part 61 and second straight line part 62. First straight line part 61 and second straight line part 62 are disposed on opposite sides of sealant 30, and extend in straight lines along the lengthwise direction of sealant 30.

As illustrated in FIG. 3, thin-film layer 60 covers printed wiring 40. In this embodiment, thin-film layer 60 covers traces 41 of printed wiring 40. More specifically, first straight line part 61 of thin-film layer 60 is broader than first trace 41a included in traces 41 so as to cover first trace 41a in entirety. Moreover, second straight line part 62 of thin-film layer 60 is broader than second trace 41b included in traces 41 so as to cover second trace 41b in entirety.

Note that one or more openings that expose part of printed wiring 40 so that printed wiring 40 and light-emitting elements 20 can be connected via wires 50 are formed in part of thin-film layer 60.

The thin-film layer 60 is thinner than sealant 30. In other words, the film thickness of thin-film layer 60 is less than the maximum height of sealant 30. Note that thin-film layer 60 has a uniform film thickness throughout. In one example, the film thickness of thin-film layer 60 is in a range of from 5 µm to 100 µm, inclusive, and is approximately in a range of from $1/30^{th}$ to $1/20^{th}$ the height of sealant 30. In this embodiment, thin-film layer 60 has a film thickness of 35 µm.

The surface of thin-film layer 60 is hydrophilic. In other words, thin-film layer 60 is made of a material whose surface is hydrophilic. When the surface of thin-film layer 60 is hydrophilic, the contact angle of the surface of thin-film layer 60 is at least 90 degrees. Note that the contact angle is a contact angle relative to water (water contact angle).

Moreover, the surface of thin-film layer 60 has a lower wettability than the surface of substrate 10. In other words, thin-film layer 60 is made of a material having a wettability that is lower than the wettability of substrate 10. In this embodiment, $\theta 2 < \theta 1 \leq 90$ degrees, where $\theta 1$ is the contact angle of the surface of thin-film layer 60 and $\theta 2$ is the contact angle of the surface of substrate 10. In one example, the contact angle $\theta 1$ of the surface of thin-film layer 60 is greater than or equal to 70 degrees ($\theta 1 \geq 70$ degrees). Moreover, the contact angle $\theta 2$ of the surface of substrate 10 is less than or equal to 30 degrees ($\theta 2 \leq 30$ degrees).

In this embodiment, thin-film layer 60 is made of a glass material. Thin-film layer 60 is a glass film configured of a crystallized glass whose main component is silicon oxide ($SiO_2$). The surface of the glass film has a wettability that is lower than the wettability of the surface of the ceramic substrate.

(Light-Emitting Module Manufacturing Method)

Figure 4:
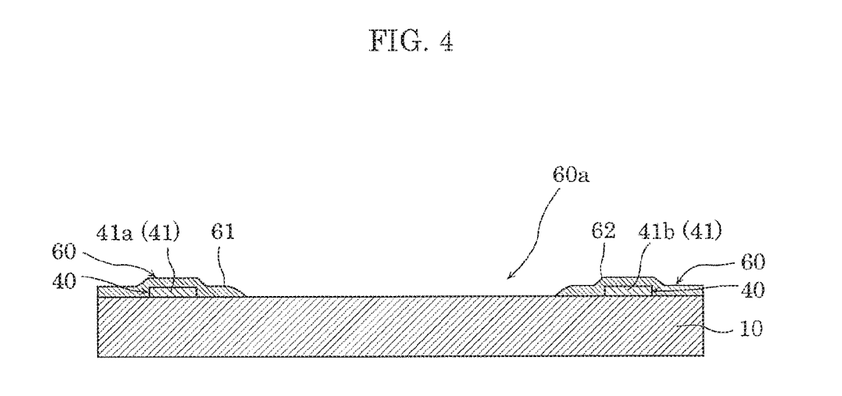
FIG. 4 is a cross sectional view illustrating a process of forming a thin-film layer in a manufacturing method of the light-emitting module according to Embodiment 1.
Figure 5:
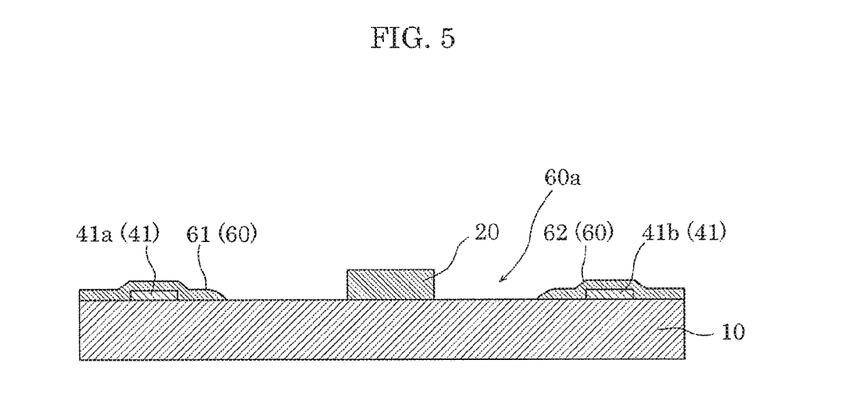
FIG. 5 is a cross sectional view illustrating a process of mounting a light-emitting element in a manufacturing method of the light-emitting module according to Embodiment 1.
Figure 6:
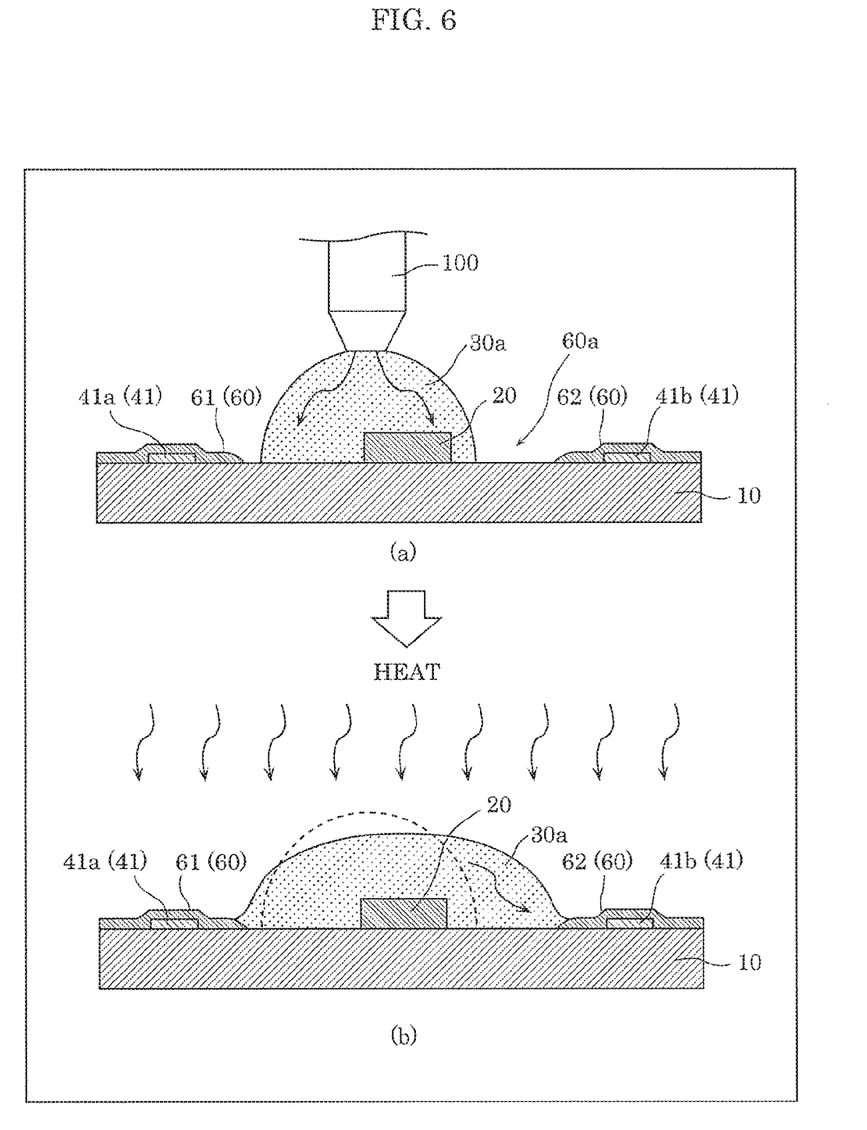
FIG. 6 is a cross sectional view illustrating a process of forming a sealant in a manufacturing method of the light-emitting module according to Embodiment 1.

Hereinafter, a manufacturing method of light-emitting module 1 will be described with reference to FIG. 4 through FIG. 6. FIG. 4 through FIG. 6 are cross sectional views for illustrating a manufacturing method of light-emitting module 1 according to Embodiment 1. FIG. 4 illustrates the process of forming thin-film layer 60, FIG. 5 illustrates the process of mounting light-emitting element 20, and FIG. 6 illustrates the process of forming sealant 30.

As illustrated in FIG. 4, thin-film layer 60 defining opening 60a is formed on substrate 10. In this embodiment, thin-film layer 60 is formed on substrate 10 on which printed wiring 40 is printed. More specifically, first straight line part 61 and second straight line part 62, which collectively correspond to thin-film layer 60 and are made of a glass film, are formed so as to cover first trace 41a and second trace 41b included in traces 41.

When a glass film is to be formed as thin-film layer 60, the glass film can be formed on substrate 10 as follows. First, a powdered fritted glass (powdered glass) is prepared, and a solvent is added to the powdered fritted glass and the mixture is kneaded into a paste, which is used to form the glass film. Next, the paste for forming the glass film is printed into a predetermined shape in a predetermined position on substrate 10. Note that the paste for forming the glass film may be applied by a method other than printing, such as by coating. Next, the substrate 10 printed with the paste for forming the glass film is sintered. The sintering softens the glass frit of the paste for forming the glass film, which forms a sintered, glass film on the surface of substrate 10.

Next, as illustrated in FIG. 5, light-emitting elements 20 are mounted on substrate 10 in opening 60a defined by thin-film layer 60. In this embodiment, LED chips are mounted as light-emitting elements 20 on the surface of substrate 10, in the region between first straight line part 61 and second straight line part 62. For example, light-emitting elements 20 can be mounted to substrate 10 by die bonding light-emitting elements 20 using, for example, a die attachment substance. Although not illustrated in the drawings, in order to electrically connect light-emitting elements 20 and printed wiring 40, light-emitting elements 20 and printed wiring 40 (lands 42 and protrusions of traces 41) are wire bonded using wires 50.

Next, as illustrated in FIG. 6, sealant 30 is formed on substrate 10 in opening 60a defined by thin-film layer 60.

In the process for forming sealant 30, as illustrated in (a) in FIG. 6, first, sealant material 30a containing a wavelength converter is applied to substrate 10 so as to seal light-emitting elements 20. More specifically, discharge nozzle 100 (dispenser nozzle) of a dispenser is orientated so as to face substrate 10, and discharge nozzle 100 is moved along the lengthwise direction of substrate 10 while sealant material 30a is discharged from discharge nozzle 100 along the row of light-emitting elements 20 mounted in a straight line on substrate 10 in the region between first straight line part 61 and second straight line part 62 of thin-film layer 60 (i.e., in opening 60a), so as to cover light-emitting elements 20. Here, sealant material 30a is discharged so as to cover printed wiring 40 and wires 50 in addition to light-emitting elements 20. In this embodiment, sealant material 30a is applied by moving discharge nozzle 100 in a single motion from one short side edge of substrate 10 to the other short side edge, but the application is not limited to this example.

A resin material containing phosphor (phosphor-containing resin) can be used as sealant material 30a that is applied. A resin material having a viscosity (at room temperature) of from 20 to 120 Pa·s, inclusive, and a thixotropic ratio (6 rpm/60 rpm) of from 2 to 10, inclusive, can be used. More preferably, a resin material having a viscosity (at room temperature) of from 30 to 60 Pa·s inclusive, and a thixotropic ratio (6 rpm/60 rpm) of from 4 to 6, inclusive, may be used. In one example, the resin material included in sealant material 30a is a thermosetting silicon resin.

As illustrated in (b) in FIG. 6, after applying sealant material 30a, sealant material 30a is heated. This cures sealant material 30a, thereby forming sealant 30 having a predetermined shape.

In the heating of sealant material 30a, the viscosity of sealant material 30a temporarily lowers, making sealant material 30a softer than when originally applied. At this time, since the wettability of the surface of thin-film layer 60 is lower than the wettability of the surface of substrate 10, as illustrated in (b) in FIG. 6, when sealant material 30a flows in opening 60a defined by thin-film layer 60 and reaches thin-film layer 60, sealant material 30a continues flowing and spreading on substrate 10, which has a higher relative wettability among thin-film layer 60 and substrate 10.

With this, even when sealant material 30a is applied offset to the left or right of light-emitting element 20, as illustrated in (a) in FIG. 6, sealant material 30a flows and spreads so as to have symmetry about a vertical line centered on light-emitting element 20, as illustrated in (b) in FIG. 6. In other words, sealant material 30a flows and spreads in opening 60a defined by thin-film layer 60 by self-alignment so as to have symmetry about a vertical line centered on light-emitting element 20. This makes it possible to form sealant 30 in a location so as to have symmetry about a vertical line centered on light-emitting element 20.

Note that, as described above, sealant material 30a flows and spreads when heated, but sealant material 30a also flows and spreads directly after being applied. In other words, by using a configuration in which the surface of thin-film layer 60 has a lower wettability than the surface of substrate 10, sealant material 30a also flows and spreads directly after being applied to substrate 10 from discharge nozzle 100.

(Light-Emitting Module Working Effects, Etc.)

Next, the working effects, etc., of light-emitting module 1 according to Embodiment 1 as well as how the present disclosure was arrived at will be described with reference to FIG. 7A through FIG. 9.

Figure 7A:
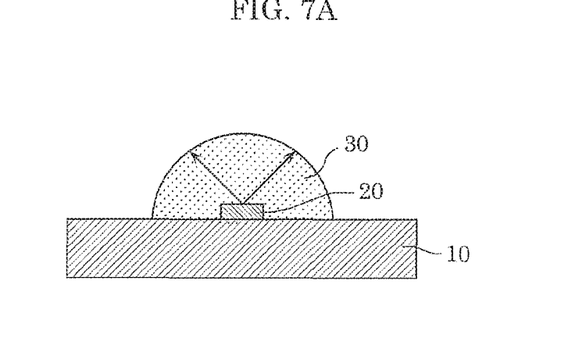
FIG. 7A is a cross sectional view of a light-emitting module according to a comparative example when there is no deviation in the positional relationship between a light-emitting element and the sealant.
Figure 7B:
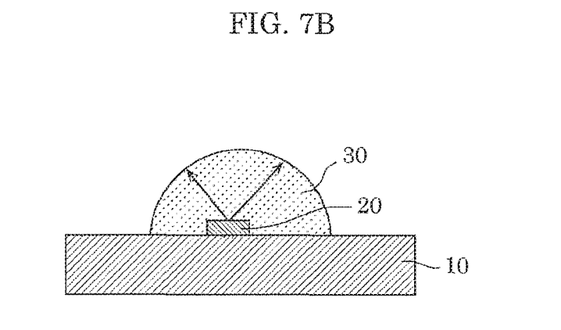
FIG. 7B is a cross sectional view of a light-emitting module according to a comparative example when there is a deviation in the positional relationship between a light-emitting element and the sealant.

FIG. 7A and FIG. 7B are cross sectional views of a light-emitting module according to a comparative example. FIG. 7A illustrates a case in which there is no deviation in the positional relationship between light-emitting element 20 and sealant 30, and FIG. 7B illustrates a case in which there is a deviation in the positional relationship between light-emitting element 20 and sealant 30.

As illustrated in FIG. 7A, when there is no deviation in the positional relationship between light-emitting element 20 and sealant 30 in the COB type light-emitting module, sealant 30 does not produce an unevenness in color since there is no difference in the lengths of the paths through sealant 30 of the light emitted by light-emitting element 20.

In contrast, as illustrated in FIG. 7B, when there is a deviation in the positional relationship between light-emitting element 20 and sealant 30, there is a difference between the distance of the path of light traveling diagonally up and to the left from light-emitting element 20 in sealant 30 and the distance of the path of light traveling diagonally up and to the right from light-emitting element 20 in sealant 30. This results in different colors on the left and right sides, i.e., an unevenness in color. For example, when light-emitting element 20 is a blue LED chip and sealant 30 contains yellow phosphor, the light traveling along the shorter path appears bluer in color, and the light traveling along the longer path appears yellower in color.

In this way, when there is a deviation in the positional relationship between light emitting element 20 and sealant 30, this results in differences in the distances that the light travels radially from light-emitting element 20 through sealant 30 (path lengths), leading to the problem of unevenness in color.

In particular, for example, with wallwasher lighting fixtures, where an oblong light-emitting module is used in a lighting fixture that emits light in two directions relative to the lighting fixture, such as to the left and right of the lighting fixture or above and below the lighting fixture, the unevenness in color is apparent.

As a result of diligent examination of this problem on the part of the inventors, they found that by forming, in the outer periphery of the region in which sealant 30 is to be formed (i.e., in the outer periphery of the region in which sealant material 30a is to be applied), a thin-film layer that allows for applied sealant material 30a to flow to a desired position, it is possible to inhibit color unevenness even when there is a deviation in the positional relationship between light-emitting element 20 and sealant material 30a.

Thus, the inventors considered forming, in the outer periphery of the region in which sealant 30 is to be formed (i.e., in the outer periphery of the region in which sealant material 30a is to be applied), a water repellent film (having a contact angle that is larger than 90 degrees) as the thin-film layer.

However, when a water repellent film is formed on substrate 10, although the surface tension of the water repellent film allows for the applied sealant material 30a to flow away from the water repellent film, since the wettability of the water repellent film is significantly lower than the wettability of substrate 10, the inventors found that the water repellent film separates from substrate 10 due to heat in, for example, the heating process.

As a result of further diligent examination on the part of the inventors, they discovered that by forming, in the outer periphery of the region in which sealant 30 is to be formed (i.e., in the outer periphery of the region in which sealant material 30a is to be applied), a peripheral layer having a lower wettability than substrate 10 as thin-film layer 60, which is hydrophilic rather than water resistant, it is possible to inhibit color unevenness even when there is a deviation in the positional relationship between light-emitting element 20 and sealant material 30a.

Light-emitting module 1 according to this embodiment, which is based on such a concept, includes: substrate 10; thin-film layer 60 disposed above substrate 10, thin-film layer 60 defining opening 60a that exposes a surface of substrate 10; light-emitting element 20 disposed above substrate 10 and in opening 60a; and sealant 30 disposed above substrate 10 and in opening 60a, sealant 30 containing a wavelength converter and sealing light-emitting element 20. The thickness of thin-film layer 60 is less than the thickness of sealant 30. An edge portion of sealant 30 is in contact with thin-film layer 60. The surface of substrate 10 and the surface of thin-film layer 60 are hydrophilic. The surface of thin-film layer 60 has a lower wettability than the wettability of the surface of substrate 10.

In this way, by using a configuration in which the wettability of the surface of thin-film layer 60 is lower than the wettability of the surface of substrate 10, when sealant 30 is being formed, even if the material for forming sealant 30 (sealant material 30a) is applied offset to the left or right of light-emitting element 20, the material for forming sealant 30 flows and spreads so as to have symmetry about a vertical line centered on light-emitting element 20. With this, the deviation in the positional relationship between light-emitting element 20 and sealant 30 can be corrected and the central position of sealant 30 can be easily made to be more proximate to the central position of light-emitting element 20. Accordingly, it is possible to inhibit color unevenness resulting from a positional deviation between light-emitting element 20 and sealant 30.

Moreover, in light-emitting module 1 according to this embodiment, $\theta 2 < \theta 1 \leq 90$ degrees, where $\theta 1$ is the contact angle of the surface of thin-film layer 60 and $\theta 2$ is the contact angle of the surface of substrate 10.

With this, the surface of thin-film layer 60 and the surface of substrate 10 are hydrophilic, and the wettability of the surface of thin-film layer 60 is lower than the wettability of the surface of substrate 10.

Moreover, in light-emitting module 1 according to this embodiment, $\theta 1 \geq 70$ degrees.

This makes it possible to increase the contact angle $\theta 1$ of the surface of thin-film layer 60 and thus increase the difference between contact angles of the surface of thin-film layer 60 and the surface of substrate 10, whereby the material for forming sealant 30 can smoothly flow and spread. Accordingly, it is possible to easily correct a deviation in the positional relationship between light-emitting element 20 and sealant 30. For example, the amount of correction of the deviation can be increased. Accordingly, it is possible to further inhibit color unevenness resulting from a positional deviation between light-emitting element 20 and sealant 30.

Moreover, in light-emitting module 1 according to this embodiment, $\theta 2 \leq 30$ degrees.

This makes it possible to increase the contact angle $\theta 2$ of the surface of substrate 10 and thus increase the difference between contact angles of the surface of thin-film layer 60 and the surface of substrate 10, whereby the material for forming sealant 30 can smoothly flow and spread. Accordingly, it is possible to more easily correct a deviation in the positional relationship between light-emitting element 20 and sealant 30. Accordingly, it is possible to further inhibit color unevenness resulting from a positional deviation between light-emitting element 20 and sealant 30.

Moreover, in light-emitting module 1 according to this embodiment, in a cross section of sealant 30, light-emitting element 20 is disposed in a central region of opening 60a defined by thin-film layer 60.

This makes it possible to realize a light-emitting module that emits light of a uniform color since it is possible to eliminate a difference between the length of the path of light traveling diagonally up and to the left from light-emitting element 20 and the length of the path of light traveling diagonally up and to the right from light-emitting element 20, in a YZ cross section of sealant 30.

Moreover, in light-emitting module 1 according to this embodiment, thin-film layer 60 includes a glass material.

This makes it possible to easily make the wettability of the surface of thin-film layer 60 lower than the wettability of the surface of substrate 10, and thus form thin-film layer 60, on which water does not flow and spread as easily as on substrate 10, in the periphery of sealant 30. Accordingly, it is possible to allow the material for forming sealant 30 to more smoothly flow and spread. Further, in this case, when a white ceramic substrate is used as substrate 10, since light from light-emitting elements 20 transmits through thin-film layer 60 (glass film) and efficiently reflects off the ceramic surface, the light extraction efficiency can be increased.

Moreover, light-emitting module 1 according to this embodiment further includes printed wiring 40 that is printed on substrate 10 and electrically connected to light-emitting element 20. Thin-film layer 60 covers printed wiring 40.

In this way, by covering printed wiring 40, which is for supplying power, with thin-film layer 60, the dielectric strength of substrate 10 can be increased and oxidation of printed wiring 40 can be inhibited. Accordingly, thin-film layer 60 may include, in addition to the section that covers traces 41 (corresponding to first straight line part 61 and second straight line part 62), a section that covers lands 42.

Moreover, in light-emitting module 1 according to this embodiment, thin-film layer 60 includes first straight line part 61 that extends in a straight line and second straight line part 62 that extends in a straight line. Second straight line part 62 is spaced from first straight line part 61 and parallel to first straight line part 61. Light-emitting elements 20 are mounted in a row between first straight line part 61 and second straight line part 62. Sealant 30 extends in a straight line between first straight line part 61 and second straight line part 62, and collectively seals light-emitting elements 20.

With this, even when sealant 30 is formed in a straight line, first straight line part 61 and second straight line part 62 included in thin-film layer 60 correct a deviation in the positional relationship between light-emitting element 20 and sealant 30 along the lengthwise direction of sealant 30. This makes it possible to inhibit color unevenness of sealant 30 along the lengthwise direction, and thus achieve a light-emitting module that emits light in a continuous straight line.

Moreover, in light-emitting module 1 according to this embodiment, substrate 10 is oblong in shape, and light-emitting elements 20 are mounted along the lengthwise direction of substrate 10.

This makes it possible to achieve a long and thin linear light source that emits light in a line.

Moreover, the light-emitting module 1 manufacturing method according to this embodiment includes: forming thin-film layer 60 on substrate 10, thin-film layer 60 defining opening 60a; mounting light-emitting element 20 on substrate 10, in opening 60a; and forming sealant 30 on substrate 10, in opening 60a. The forming of sealant 30 includes applying sealant material 30a on substrate 10 to seal light-emitting element 20. Sealant material 30a contains a wavelength converter. The thickness of thin-film layer 60 is less than the thickness of sealant material 30a. The surface of substrate 10 and the surface of thin-film layer 60 are hydrophilic. The surface of thin-film layer 60 has a lower wettability than the wettability of the surface of substrate 10.

With this, sealant; material 30a flows and spreads on substrate 10 rather than thin-film layer 60, since substrate 10 is relatively lower in wettability among thin-film layer 60 and substrate 10, even when sealant material 30a is applied offset to the right or left of light-emitting element 20, sealant material 30a can flow and spread by self-alignment so as to correct the positional deviation between light-emitting element 20 and sealant material 30a. With this, the central position of sealant 30 can be easily made to be more proximate to the central position of light-emitting element 20, making it possible to achieve light-emitting module 1 in which color unevenness resulting from a positional deviation between light-emitting element 20 and sealant 30 is inhibited.

Further, in the light-emitting module 1 manufacturing method according to this embodiment, sealant material 30a is a thermosetting resin, and the applying of sealant material 30a includes heating sealant material 30a after application of sealant material 30a.

With this, since sealant material 30a is softer when heated compared to directly after it is applied, sealant material 30a more easily flows and spreads, making it easier to correct a deviation in the positional relationship between light-emitting element 20 and sealant 30.

Note that in this embodiment, a transparent glass film is used as thin-film layer 60 since a white ceramic substrate having a highly reflective surface is used as substrate 10, but this example is not limiting. Any material that has a hydrophilic surface and is lower in wettability than substrate 10 can be used as thin-film layer 60. For example, a highly reflective white resin material (white resist) having a reflectivity of approximately 98% can be used as thin-film layer 60. This makes it possible to increase the light extraction efficiency even when, for example, a resin substrate, which has a surface with a low reflectivity, is used as substrate 10. Moreover, the wettability of a white resist film is lower than the wettability of a glass film. In other words, the contact angle of a white resist film is less than the contact angle of a glass film. Accordingly, by using a white resist film as thin-film layer 60, the difference in the contact angles of the surface of thin-film layer 60 and the surface of substrate 10 can be increased more so than when a glass film is used, making it possible for the material for forming sealant 30 (sealant material 30a) to smoothly flow and spread. Accordingly, it is possible to more easily correct a deviation in the positional relationship between light-emitting element 20 and sealant 30.

Embodiment 2

Figure 8:
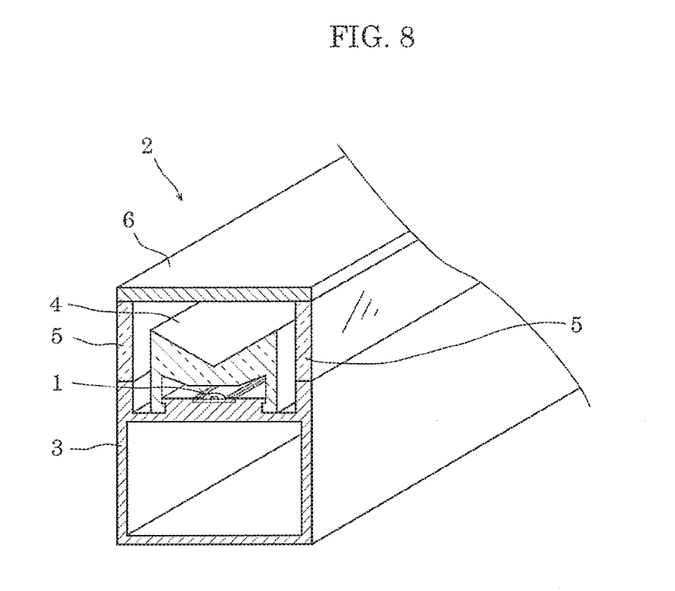
FIG. 8 is a perspective cross sectional view of the lighting fixture according to Embodiment 2.
Figure 9:
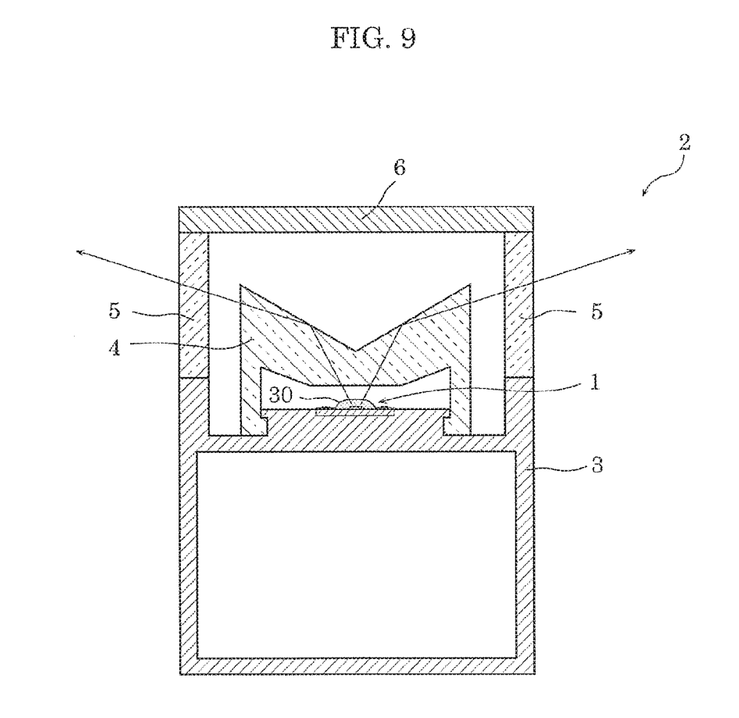
FIG. 9 is a cross sectional view of the lighting fixture according to Embodiment 2.

Next, lighting fixture 2 according to Embodiment 2 will be described with reference to FIG. 8 and FIG. 9. FIG. 8 is a perspective cross sectional view of lighting fixture 2 according to Embodiment 2. FIG. 9 is a cross sectional view of lighting fixture 2 according to Embodiment 2.

As illustrated in FIG. 8 and FIG. 9, lighting fixture 2 according to this embodiment is a wallwasher lighting apparatus, and is, for example, installed on or in the surface of a wall. In this case, lighting fixture 2 emits light in two directions, such as to the left and right or up and down, so as to illuminate the surface of the wall on either side of lighting fixture 2.

Lighting fixture 2 includes light-emitting module 1 according to Embodiment 1, pedestal 3, lens 4, pair of light-transmissive covers 5, and light blocking cover 6.

Pedestal 3 is a chassis that includes a supporting part that supports light-emitting module 1 and a housing part that houses a power supply unit (not illustrated in the drawings) for causing light-emitting module 1 to emit light. Pedestal 3 is oblong in shape so as to extend along the lengthwise direction of light-emitting module 1. For example, pedestal 3 is made of a metal or resin material.

Lens 4 is an optical component having a function of controlling the distribution of light emitted by light-emitting module 1. Lens 4 is disposed so as to cover light-emitting module 1. In this embodiment, lens 4 controls light distribution by refracting light emitted by light-emitting module 1 in two directions: left and right. More specifically, lens 4 controls the distribution of light so as to cause the light from light-emitting module 1 to be emitted toward pair of light-transmissive covers 5 disposed on the left and right of lens 4. In other words, the light emitted to the left and right from lens 4 is incident on pair of light-transmissive covers 5. Lens 4 is oblong in shape so as to extend along the lengthwise direction of light-emitting module 1. For example, lens 4 is made of a transparent resin or glass material.

Pair of light-transmissive covers 5 are disposed as side walls of pedestal 3. More specifically, one cover among pair of light-transmissive covers 5 is provided as the left wall of pedestal 3 and the other cover among pair of light-transmissive covers 5 is provide as the right wall of pedestal 3. Moreover, pair of light-transmissive covers 5 are disposed on the sides of lens 4. Each lens in the pair of light-transmissive covers 5 is oblong in shape so as to extend along the lengthwise direction of light-emitting module 1. For example, pair of light-transmissive covers 5 is made of a transparent resin or glass material. Note that in order to give pair of light-transmissive covers 5 light diffusion properties (light scattering properties), a milky white film may be formed on the surface of each light-transmissive cover 5, a light diffusing material may be dispersed in each light-transmissive cover 5, or minute protrusions and recesses may be formed on and in the surface of each light-transmissive cover 5.

Light blocking cover 6 opposes lens 4 so as to cover the opening of pedestal 3. With this, light from light-emitting module 1 that leaks upward above lens 4 can be blocked, making it possible to achieve a light distribution with a high degree of directionality in which light from light-emitting module 1 is emitted in two directions, left and right, from lens 4. Light blocking cover 6 is oblong in shape so as to extend along the lengthwise direction of light-emitting module 1. For example, light blocking cover 6 is made of a transparent resin or metal material.

In this way, light-emitting module 1 can be used as an oblong wallwasher lighting fixture 2.

Variation

Hereinbefore, light-emitting module 1 and lighting fixture 2 according to the present disclosure has been described based on embodiments, but the present disclosure is not limited to the above embodiments.

Figure 10:
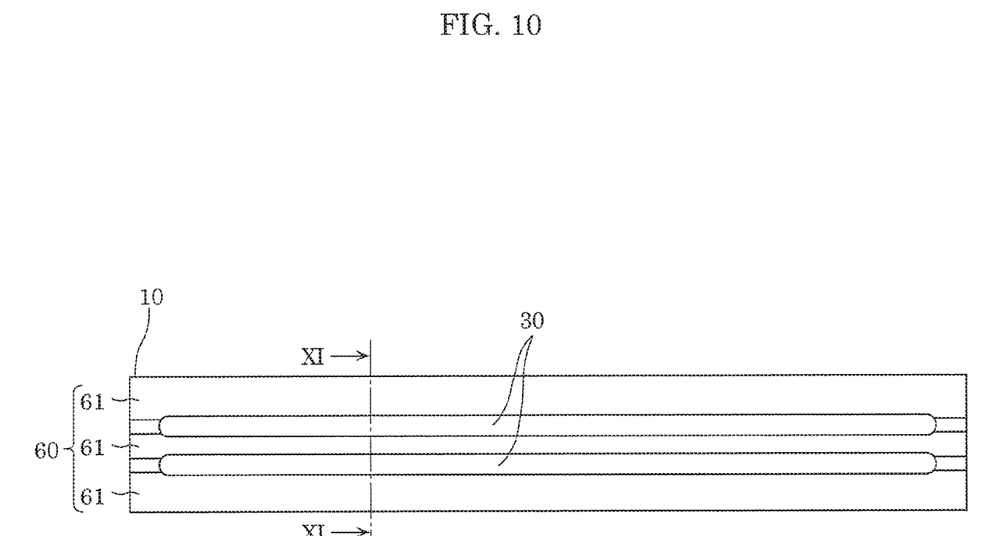
FIG. 10 is a plan view of a light-emitting module according to a variation.
Figure 11:
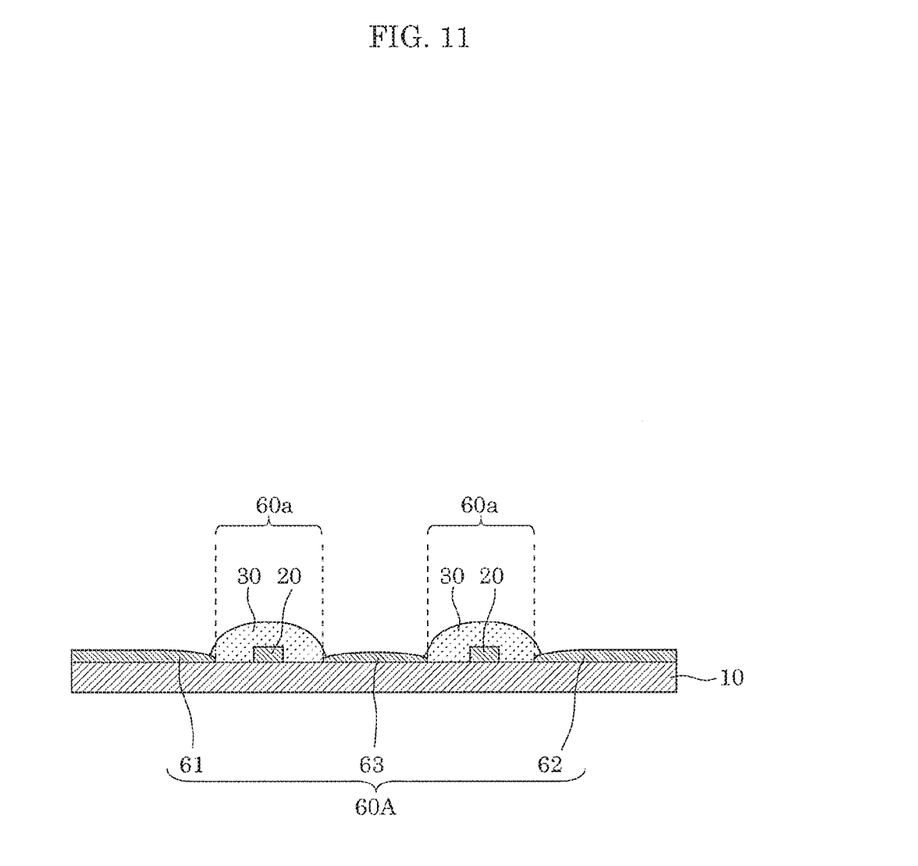
FIG. 11 is a cross sectional view of the light-emitting module according to a variation, taken at line XI-XI in FIG. 10.

For example, in Embodiment 1 above, light-emitting elements 20 are arranged in no more than one line, but light-emitting elements 20 may be arranged in a plurality of lines. In this case, sealant 30 may extend in a plurality of lines, each corresponding to one of the lines of light-emitting elements 20. For example, as illustrated in FIG. 10, when light-emitting elements 20 are arranged in two lines, sealant 30 may be formed in two lines so as to correspond to the number of lines of light-emitting elements 20. In this case, as illustrated in FIG. 11, thin-film layer 60A may define openings 60a corresponding to each of the two lines of sealant 30. More specifically, as illustrated in FIG. 10 and FIG. 11, thin-film layer 60A includes third straight line part 63 between first straight line part 61 and second straight line part 62, and sealant 30 may be formed in a first region between first straight line part 61 and third straight line part 63 (opening 60a) and a second region between third straight line part 63 and second straight line part 62 (opening 60a).

Moreover, in Embodiment 1 above, substrate 10 has an oblong shape, but the shape of substrate 10 is not limited to this example. For example, substrate 10 may have a square shape, and may have a shape other than a four-sided shape, such as a polygonal or circular shape. Moreover, when sealant 30 is formed in a plurality of lines on substrate 10, the lengths of the lines of sealant 30 may vary.

Moreover, in Embodiment 1 above, sealant 30 is formed so as to collectively seal all light-emitting elements 20, but sealant 30 is not limited to this example. For example, sealant 30 may be formed in a plurality of discrete units that individually seal light-emitting elements 20.

Moreover, in Embodiment 1 above, light-emitting module 1 is configured to emit white light using blue LED chips and yellow phosphor, but light-emitting module 1 is not limited to this example. For example, a configuration in which blue LED chips are paired with a phosphor-containing resin containing red and green phosphor may be used to produce white light.

Moreover, in Embodiment 1 above, LED chips that emit light of a color other than blue may be used. For example, when ultraviolet LED chips that emit ultraviolet light shorter in wavelength than the blue light emitted by the blue LED chips, a configuration in which the ultraviolet LED chips are paired with phosphors that emit the three primary colors (red, green, and blue) when excited mainly by ultraviolet light may be used.

Moreover, in Embodiment 1 above, phosphor is used as the wavelength converter, but the wavelength converter is not limited to this example. For example, any material that includes a substance that absorbs light of a given wavelength and emits light of a different wavelength, such as a semiconductor, metal complex, organic dye, or pigment, may be used as the wavelength converter.

Moreover, in Embodiments 1 and 2 above, light-emitting module 1 may be configured such that the light it emits is capable of being dimmed or changed in color.

Moreover, in Embodiment 2 above, an example is given in which light-emitting module 1 is used in a wallwasher lighting fixture, but this example is not limiting. For example, light-emitting module 1 may be used in an oblong light apparatus such as a tube lamp or base light, or in a different lighting apparatus, such as a down light, spot light, ceiling light, or bulb-shaped lamp. Moreover, light-emitting module 1 can also be used in a device used for purposes other than lighting purposes.

While the foregoing has described one or more embodiments and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

What is claimed is:

1. A light-emitting module, comprising:
   a substrate;
   a thin-film layer disposed above the substrate, the thin-film layer defining an opening that exposes a surface of the substrate;
   a light-emitting element disposed above the substrate and in the opening; and
   a sealant disposed above the substrate and in the opening, the sealant containing a wavelength converter and sealing the light-emitting element,
   wherein a thickness of the thin-film layer is less than a thickness of the sealant,
   an edge portion of the sealant is in contact with the thin-film layer, and
   wherein
   $\theta_2 < \theta_1 \leq 90$ degrees,
   where $\theta_1$ is a water contact angle of the surface of the thin-film layer and $\theta_2$ is a water contact angle of the surface of the substrate.

2. The light-emitting module according to claim 1, wherein
   $\theta_1 \geq 70$ degrees.

3. The light-emitting module according to claim 1, wherein
   $\theta_2 \leq 30$ degrees.

4. The light-emitting module according to claim 1, wherein
in a cross section of the sealant, the light-emitting element is disposed in a central region of the opening.

5. The light-emitting module according to claim 1, wherein
the thin-film layer includes a glass material.

6. The light-emitting module according to claim 1, further comprising:
printed wiring provided on the substrate and electrically connected to the light-emitting element,
wherein the thin-film layer covers the printed wiring.

7. The light-emitting module according to claim 1, wherein
the thin-film layer includes a first straight line part that extends in a straight line and a second straight line part that extends in a straight line, the second straight line part being spaced from the first straight line part and extending parallel to the first straight line part,
the light-emitting element comprises a plurality of light-emitting elements mounted in a row between the first straight line part and the second straight line part, and
the sealant extends in a straight line between the first straight line part and the second straight line part, and collectively seals the plurality of light-emitting elements.

8. The light-emitting module according to claim 7, wherein
the substrate is oblong in shape, and
the plurality of light-emitting elements are mounted along a lengthwise direction of the substrate.

9. A lighting fixture, comprising:
the light-emitting module according to claim 1.

10. A light-emitting module manufacturing method, comprising:
forming a thin-film layer above a substrate, the thin-film layer defining an opening;
mounting a light-emitting element above the substrate, in the opening; and
forming a sealant above the substrate, in the opening,
wherein the forming of the sealant includes applying a sealant material above the substrate to seal the light-emitting element, the sealant material containing a wavelength converter,
a thickness of the thin-film layer is less than a thickness of the sealant material, and
wherein
$\theta_2 < \theta_1 \leq 90$ degrees,
where $\theta_1$ is a water contact angle of the surface of the thin-film layer and $\theta_2$ is a water contact angle of the surface of the substrate.

11. The light-emitting module manufacturing method according to claim 10, wherein
the sealant material is a thermosetting resin, and
the applying of the sealant material includes heating the sealant material after application of the sealant material.

12. The light emitting module according to claim 1, wherein the substrate has a rectangular shape and a ratio of a length to a width of the rectangular shape is equal to or more than 10.

13. The light emitting module manufacturing method according to claim 10, wherein the mounting of a light-emitting element above the substrate comprises positioning the light-emitting element in a central region of the opening.

14. The lighting emitting module manufacturing method according to claim 10, wherein the forming of a thin film layer comprises forming the thin film layer to include a glass material.

15. The light-emitting module manufacturing method according to claim 10, further comprising provided printed wiring on the substrate and electrically connected to the light-emitting element, and the forming a thin film layer comprises forming the thin film layer to cover the printed wiring.

16. The light-emitting module manufacturing method according to claim 11, wherein heating the sealant material comprises heating the sealant material so as to enable the sealant material to flow, within the opening, and to flow onto the thin film layer adjacent the opening.

17. The light-emitting module manufacturing method according to claim 10, wherein
$\theta_1 \geq 70$ degrees.

18. The light-emitting module manufacturing method according to claim 10, wherein
$\theta_2 \leq 30$ degrees.

* * * * *